United States Patent
Menezes

(10) Patent No.: US 10,090,833 B2
(45) Date of Patent: Oct. 2, 2018

(54) LOW POWER RESET CIRCUIT

(71) Applicant: Texas Instruments Incorporated, Dallas, TX (US)

(72) Inventor: Vinod Menezes, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/608,436

(22) Filed: May 30, 2017

(65) Prior Publication Data

US 2017/0294910 A1 Oct. 12, 2017

Related U.S. Application Data

(63) Continuation of application No. 15/093,343, filed on Apr. 7, 2016, now Pat. No. 9,698,770.

(51) Int. Cl.
*H03L 7/00* (2006.01)
*H03K 17/22* (2006.01)
*H03K 5/04* (2006.01)
*H03K 5/24* (2006.01)

(52) U.S. Cl.
CPC ............. *H03K 17/223* (2013.01); *H03K 5/04* (2013.01); *H03K 5/2472* (2013.01)

(58) Field of Classification Search
CPC .................................................... H03K 17/223
See application file for complete search history.

(56) References Cited

U.S. PATENT DOCUMENTS

| | | |
|---|---|---|
| 2010/0201410 A1 | 8/2010 | Illegems |
| 2015/0130519 A1* | 5/2015 | Amick ................... H03K 17/22 327/143 |

* cited by examiner

*Primary Examiner* — Daniel Puentes
(74) *Attorney, Agent, or Firm* — Michael A. Davis, Jr.; Charles A. Brill; Frank D. Cimino

(57) ABSTRACT

A low power reset circuit includes a bias generator for receiving an operating voltage generated by a power supply and generating a bias voltage in response to the received operating voltage. The operation speed of a shaper for generating a shaped signal for indicating the operating voltage and the operation speed of a comparator for comparing a threshold reference voltage with the shaped signal are both controlled in response to the generated bias voltage. The comparator also generates a comparison signal for indicating a result of the comparison. In response to the comparison signal, a reset signal generator generates a reset signal for resetting protected circuitry powered by the operating voltage generated by the power supply.

11 Claims, 7 Drawing Sheets

LOW POWER RESET CIRCUIT

CROSS-REFERENCE TO RELATED APPLICATIONS

This application is a continuation of U.S. patent application Ser. No. 15/093,343 filed Apr. 7, 2016, which is hereby fully incorporated herein by reference for all purposes.

BACKGROUND

Many applications of integrated circuits include circuits that only operate properly while the power applied to such devices has an applied voltage that lies between a maximum operating voltage and a minimum operating voltage. When such a device is "powered on" (e.g., by initially applying operating power to a device), the device normally does not properly function until the voltage of the applied power reaches and remains in the proper voltage range. Likewise, when the applied power is insufficient to maintain the operating voltage above the minimum operating voltage (e.g., in a "brownout" condition), the device normally may not properly function even when applied power once again reaches and remains in the proper voltage range due to, for example, state information being lost due to lack of power. Voltage monitoring circuits are typically used to assert reset signals to help minimize improper functioning of the device. However, such circuits are often unsuitable for many applications due to consumption of substantial amounts of power and/or requiring substantial amount of area in a circuit layout.

SUMMARY

The problems noted above can be addressed in a low power reset circuit that includes a bias generator for receiving an operating voltage generated by a power supply and generating a bias voltage in response to the received operating voltage. The operation speed of a shaper for generating a shaped signal for indicating the operating voltage and the operation speed of a comparator for comparing a threshold reference voltage with the shaped signal are both controlled in response to the generated bias voltage. The comparator also generates a comparison signal for indicating a result of the comparison. In response to the comparison signal, a reset signal generator generates a reset signal for resetting protected circuitry powered by the operating voltage generated by the power supply.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "input" can mean either a source or a drain (or even a control input such as a gate where context indicates) of a PMOS (positive-type metal oxide semiconductor) or NMOS (negative-type metal oxide semiconductor) transistor. The term "mode" can mean a particular architecture, configuration (including electronically configured configurations), arrangement, application, and the like, for accomplishing a purpose. The term "processor" can mean a circuit for processing, a state machine and the like for execution of programmed instructions for transforming the processor into a special-purpose machine, circuit resources used for the processing, and combinations thereof.

Figure 1:
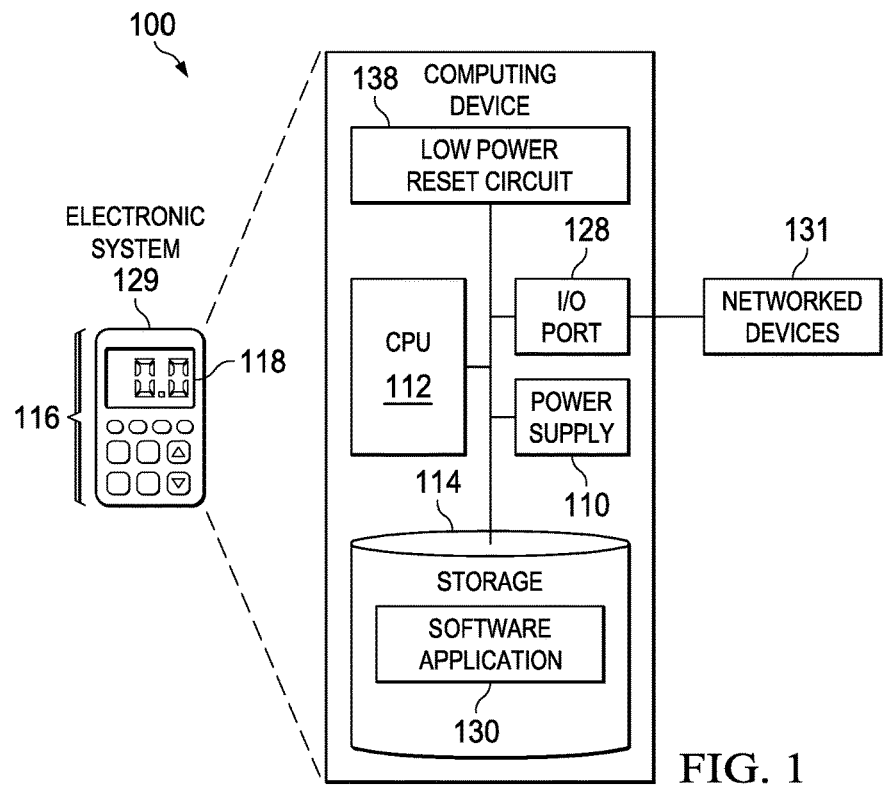
FIG. 1 shows an illustrative computing system 100 in accordance with certain embodiments of the disclosure.

FIG. 1 shows an illustrative computing system 100 in accordance with certain embodiments of the disclosure. For example, the computing system 100 is, or is incorporated into, an electronic system 129, such as a computer, electronics control "box" or display, communications equipment (including transmitters), or any other type of electronic system arranged to generate electrical signals.

In some embodiments, the computing system 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores instructions for one or more software applications 130 (e.g., embedded applications) that, when executed by the CPU 112, perform any suitable function associated with the computing system 100.

The CPU 112 comprises memory and logic circuits that store information frequently accessed from the storage 114. The computing system 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors (including sensors), gyros, accelerometers, and the like. The CPU 112 is coupled to I/O (Input-Output) port 128, which provides an interface operable to receive input from (and/or provide output to) networked devices 131. The networked devices 131 can include any device capable of point-to-point and/or networked communications with the computing system 100. The computing system 100 can also be coupled to peripherals and/or computing devices, including tangible, non-transitory media (such as flash memory) and/or cabled or wireless media. These and other input and output devices are selectively coupled to the computing system 100 by external devices using wireless or cabled connections. The storage 114 can be accessed by, for example, by the networked devices 131.

The CPU 112 is coupled to I/O (Input-Output) port 128, which provides an interface operable to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, charged capacitor, and the like).

The computing system 100 includes a low power reset circuit 138 for providing reset protection to help ensure proper operation of the circuitry to be protected. As discussed below, the low power reset circuit 138 typically includes an always-on, substantially "zero-current" (e.g., a very low current that can be maintained from a semiconductor structure for a period longer than around one to over 10 years) current reference source. In an embodiment, the always-on, substantially zero-current reference source is an analog floating gate (AFG) element. The AFG element is formed in a semiconductor substrate (e.g., in the same substrate as the circuitry for which the low power reset circuit 138 is provided to protect). The AFG functions as a very-low dissipative capacitor that is typically capable of maintaining a stored charge for a period longer than around 10 years.

The AFG element is coupled to a bias generator and comparator (also discussed below). In an embodiment, the bias generator and comparator are designed using sub-threshold circuits such that direct current flow is avoided. In contrast to many conventional solutions, the comparator threshold is selectively programmable (e.g., after manufacture and/or deployment of the computing system 100) such that the threshold (e.g., "trip point") for protecting an (e.g., arbitrary) circuit can be optimized (e.g., at design time or after deployment) for the circuit.

Inputs to the comparator are filtered such that both fast transients or slow transients of the operating voltage (including rail to rail swing) do affect proper operation of the comparator. Likewise, "interlocks" are provided in the design to help prevent the comparator from making incorrect comparison decisions during power supply ramping (e.g., the voltage transition from around zero to a stable operating voltage). Typically encountered operating voltage waveforms are discussed below with reference to (at least) FIG. 2.

Figure 2:
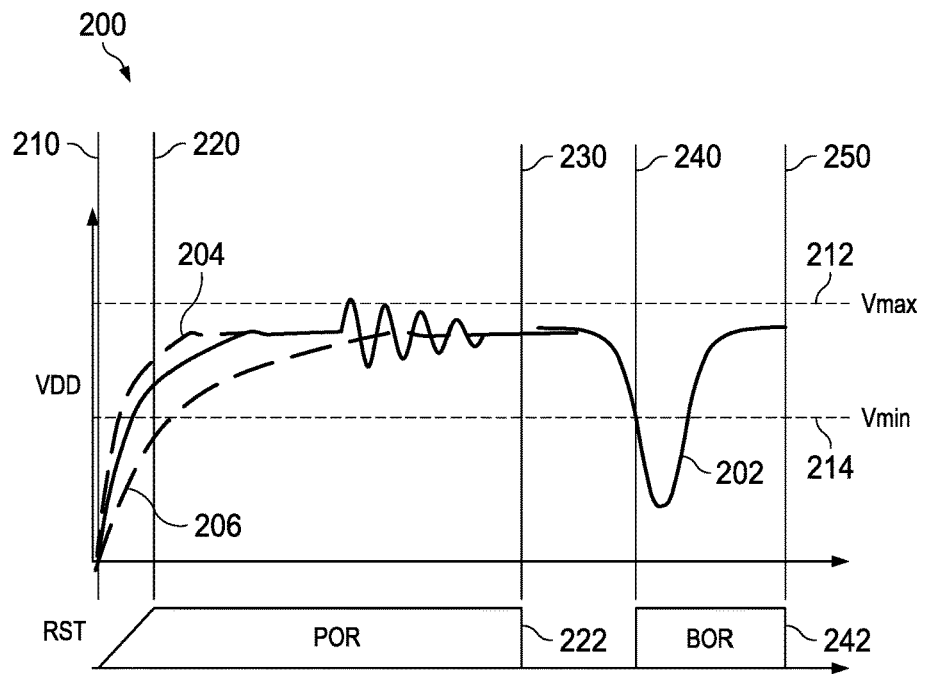
FIG. 2 is a diagram of an example operating voltage waveform.

FIG. 2 is a diagram of an example operating voltage waveform. Diagram 200 provides an illustration of operating voltage waveform 202 in response to power-on and brownout conditions. At time 210, power is supplied to a circuit to provide operating power. In response to the applied power, operating voltage (VDD) waveform 202 rises (ramps up). The rise time used to reach a minimum operating voltage (Vmin) 214 varies in accordance with varying systems, circuits, and applications. Waveform 204 illustrates a possible trajectory for the operating voltage waveform 202 when the rise time is relatively quick, whereas waveform 206 illustrates a possible trajectory for the operating voltage waveform 202 when the rise time is relatively slow. The minimum operating voltage is typically a voltage below which operation of a circuit will likely not safely (e.g., correctly) operate.

As the operating voltage waveform 202 ramps up (e.g., as a result of applying power to the circuitry for generating a reset signal such as RST), the waveform of the power on reset (POR) signal 222 likewise rises until it is fully asserted at time 220. At time 220, the POR signal 222 is fully asserted and reaches a voltage that is associated with an activated state. The assertion of the POR signal 222 is typically used to prevent operation of circuitry before such time as the operating voltage waveform 202 settles and the circuitry is powered up to an initial operating state. For example, the operating voltage waveform 202 may oscillate between Vmin 214 and Vmax (maximum operating voltage) 212 before converging on a stable voltage at time 230 (e.g., during the oscillation time, the circuitry being controlled by the POR signal 222 might not properly operate). At time 230, the POR signal 222 is deasserted (e.g., changes logic state from being active) and the circuitry under control of the POR signal 222 starts initial operation (such that, for example, a processor boots by fetching an initial instruction).

Ideally, the operating voltage waveform 202 remains at a voltage level between Vmin 214 and Vmax 212. However, when power is removed (or otherwise sufficiently unavailable), the operating voltage waveform 202 falls below Vmin 214. When the operating voltage waveform 202 falls below Vmin 214, a brownout reset (BOR) signal 224 is asserted at time 240 (which, for example stops operation and/or resets a logic state of the circuitry under control of the BOR signal 224). After the operating voltage waveform 202 rises above Vmin 214, the brownout period is determined to be over and the brownout reset signal is deasserted at time 250 (e.g., such that circuitry controlled by the BOR signal 224 can resume or restart operation).

In at least some applications, operation of circuitry in brownout conditions can render such circuitry unsuitable and/or unreliable for one or more of its intended purposes. For example, power supply "glitches" can destroy the contents of a nonvolatile memory (such as firmware stored in ferroelectric RAM) when the contents are being accessed using a destructive read process. However, setting a trip point (e.g., the Vmin 214) at higher settings can result, for example, in unused capacity of power storage (e.g., available battery power) and/or reduced operating life of the storage device (e.g., battery).

Conventional approaches using self-generated threshold or dynamic schemes are often unable to accurately and/or quickly respond to operating power variations over full operating voltage ranges and to respond within a wide variation of time durations of power supply output voltage ramping (which, depending the application, could span magnitudes that vary from between hundreds of nanoseconds to seconds). Often, the accuracy of conventional trip point using "pull-down" currents can (e.g., substantially) vary in accordance with variations in process, temperature, and operating voltages. (e.g., having a trip point that can so-vary between 0.9 volts and 1.9 volts for a 3-volt system). Further, excessive slew rates in operating voltages often reduce the trip point accuracy of circuitry (which normally rely on operating voltage power) used to determine trip point measurements.

In the many applications where ramping times of power supplies (e.g., the power-up delays) are typically unknown at design time (e.g., where the ramping times can be measured in units ranging from nanoseconds to days), it appears that conventional solutions do not include a reliable active element zero-current-type delay element. Further, zero-current-type passive RC (resistor-capacitor) filters normally will mask VDD supply glitches that occur during a brownout event that should otherwise call for a reset. At relatively slow ramping times where the comparator bias takes longer to settle, the comparator may "glitch" (e.g., produce an invalid output), and also produce an incorrect evaluation in the absence of an established tail current.

Bandgap voltage reference generators, potential dividers, and CMOS threshold-based voltages used in conventional approaches typically have substantial drawbacks. The bandgap voltage references generators typically consume substantial amounts of power and have long startup times and (during which time, no resistor trim values can be loaded while the supply to the bandgap itself can be unreliable). The potential dividers (e.g., resistor networks) and comparators typically consume substantial amounts of current and depend on an often-unstable voltage reference. The approaches that generate reference voltages based on MOS transistor threshold voltages typically substantially vary in accordance with variation in process, temperature, and operating voltages (PTV) conditions.

Figure 3:
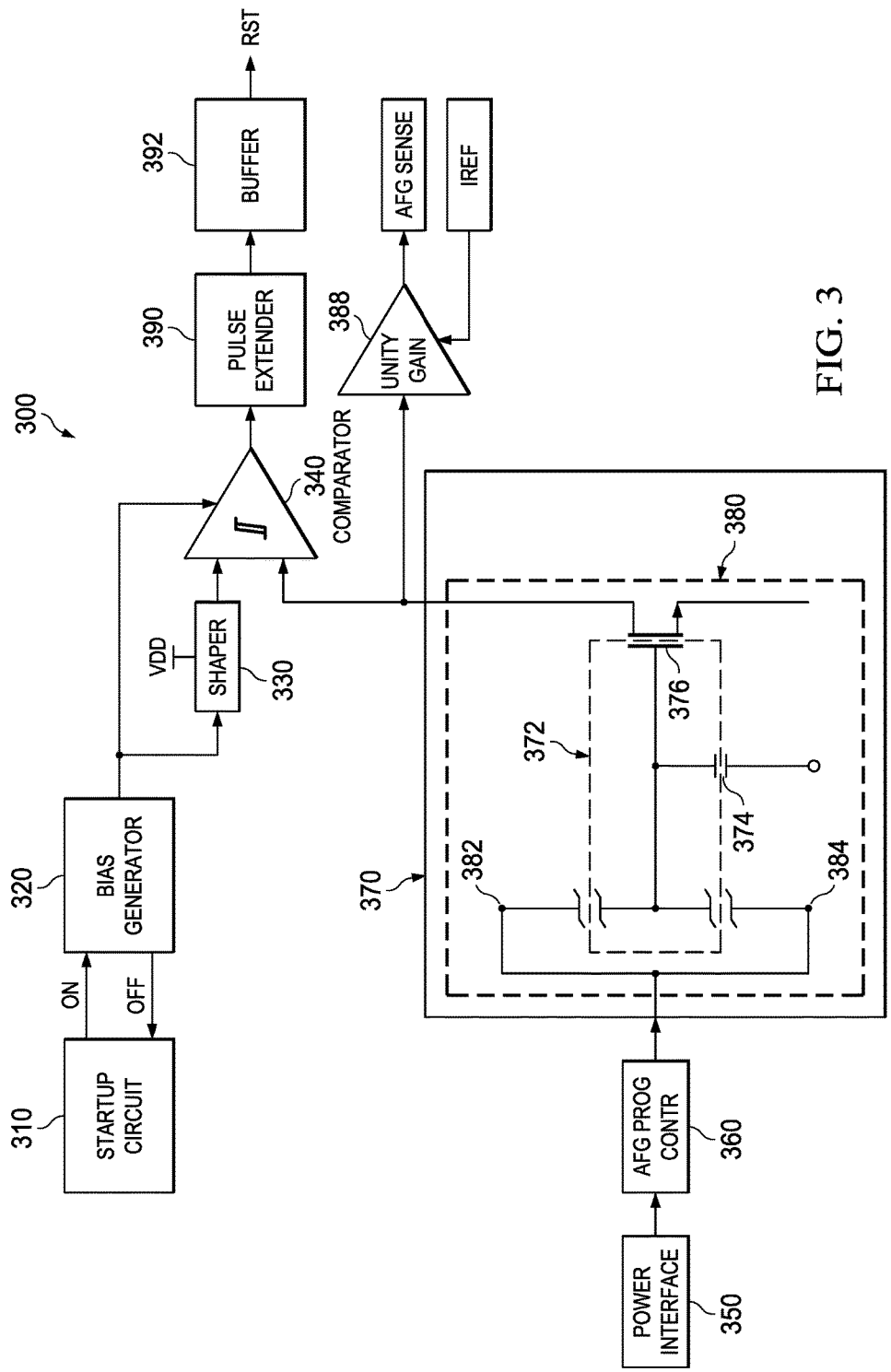
FIG. 3 is a schematic of a low power reset circuit including an AFG-based voltage reference in accordance with embodiments of the present disclosure.

FIG. 3 is a schematic of a low power reset circuit including an AFG-based voltage reference in accordance with embodiments of the present disclosure. The low power reset circuit 300 includes a startup circuit 310, a bias generator 320, a (e.g., waveform) shaper 330, a comparator 340, a power interface 350, an analog floating gate (AFG) programming controller 360, an AFG capacitor 370, a unity gain (UG) amplifier 388, a pulse extender 390, and a buffer 392. The components of the power reset circuit 300 (including portions thereof) can be on the same or different substrate as circuitry controlled by the buffered reset (RST).

In operation, the startup circuit 310 controls the state of the bias generator 320 such that the bias generator 320 starts to generate a bias voltage for powering the comparator 340 when power is (e.g., initially) applied to the low power reset circuit 300. As discussed below, the comparator 340 is prevented from toggling (e.g., changing a "latched" state) until such time the bias voltage generated by the bias generator 320 achieves a proper output voltage suitable for biasing (e.g., powering) the tail current of comparator 340. After the bias voltage generated by the bias generator 320 reaches a voltage suitable for biasing the comparator 340, the bias generator 320 signals the reset circuit 310 to reset (e.g., which prepares the state circuitry in the startup circuit 310 for controlling the startup of the bias generator 320 during a subsequent power up).

The shaper 330 is operable to shape the waveform of the operating voltage (VDD), for example, to remove relatively small transients (e.g., such as caused by electrical noise) and control the slew rate of the shaped waveform. The shaper 330 is operable to control the slew rate of the shaped waveform such that the comparator 340 is operable to compare the voltage of the shaped waveform against a reference voltage generated by a long-term storage device. The long-term storage device is a device such as the AFG capacitor 370, which is able to store a voltage for a duration that is at least one year, and often exceeds 10 years. The comparator 340 is discussed below with respect to FIG. 4 and the shaper 330 is discussed below with respect to FIG. 5.

The voltage stored using the AFG capacitor 370 is an analog value (e.g., not a binary value) such that any voltage in a range of voltages between a maximum operating voltage and a minimum operating voltage can be selectively programmed and stored. The AFG capacitor 370 is operable to be programmed via the AFG programming controller 360.

The power interface 350 optionally includes pads (e.g., including circuits for electrostatic discharge protection) for input terminals (e.g., pins or pads) operable to receive operating power, relatively high voltages for programming non-volatile memory (such as AFG capacitor 370), and control signals for programming and/or reading the contents of the non-volatile memory. The control signals are optionally received from a processor (e.g., executing instructions to transform the CPU 112 into a special-purpose machine) for programming and retrieving the contents of the non-volatile memory.

The AFG programming controller (AFG PROG CONTR) 360 is operable to receive the control signals and programming voltages from the power interface 370. The AFG programming controller 360 (e.g., itself) optionally includes non-volatile memory such that the AFG programming controller 360 is operable to successfully accomplish programming and retrieving the contents of the AFG capacitor 370 in view of reset, power outage, and/or brownout conditions.

The AFG capacitor 370 is a quantum tunneling charge storage device and includes a polysilicon (poly) floating gate 372, which is formed over an oxide layer (not shown), which in turn is formed over the substrate 380. The polysilicon (poly) floating gate 372, a first oxide layer (not shown), and the substrate 380 form a structure such as signal capacitor 374. The signal capacitor 374 is operable as a non-volatile memory, wherein the positive tunneling terminal 382 and the negative tunneling terminal 384 are operable to inject a charge into the signal capacitor 374 in the presence of a strong tunneling field applied (e.g., by the AFG programmable controller 360) to the oxide layer. The strong tunneling field is generated by applying the relatively high voltage to a control gate (not shown), which is formed over a second oxide layer (not shown), which in turn is formed over the polysilicon floating gate 372.

The sense transistor 376 is operable, when activated, to develop a voltage at the drain of the sense transistor 376, wherein the developed voltage has analog magnitude developed in accordance with a charge stored in the signal capacitor 374. The drain of the sense transistor 376 is coupled to inputs of the unity gain amplifier 388 buffer and the comparator 340. The external inputs to which the drain of the sense transistor 376 is coupled are high impedance inputs. The high impedance inputs are typically coupled (e.g., connected) to a gate of CMOS transistors such that the (e.g., total direct) current drain of the sense transistor 376 is substantially zero (e.g., having no DC path to ground). The sense transistor 376 can be formed as an input transistor 406 (discussed below with reference to FIG. 4) operable to control one arm (or "side") of a differential amplifier of comparator 340 and/or formed as a input transistor (not shown) of unity gain amplifier 388, where the transistors each respectively control one arm (or "side") of a differential amplifier. For example, the polysilicon floating gate 372 (e.g., forming one plate of the signal capacitor 374) can be coupled to the gates of the input transistors via conductive structures of polysilicon (which is the same type of material as the material from which the polysilicon floating gate 372 is made).

The unity gain (UG) amplifier 388 is a buffer operable to sense the voltage developed at the drain of the sense transistor 376 (e.g., without draining current from the sense transistor 376) and to actively amplify the sensed voltage to generate the AFG sense signal (and/or for generating a current reference) as a relatively stable reference signal IREF for the protected circuitry. Accordingly, the charge stored on the signal capacitor 374 can be remotely (e.g., by circuitry relatively far away, whether on a common substrate or not) sensed and/or sampled while drawing substantially zero current from the signal capacitor 374.

The comparator 340 is operable to compare the shaped operating voltage with the (e.g., threshold or trip-point) voltage developed at the drain of the sense transistor 376. Accordingly, an analog voltage threshold for specifying a "minimum" operating voltage is non-destructively stored by programming the signal capacitor 372 with an analog charge level for developing the analog voltage threshold at the drain of the sense transistor 374. When the shaped operating voltage drops below the analog voltage threshold, the comparator 340 is operable to toggle, such that a reset signal is generated for protecting operating circuitry (including partly operating circuitry being powered up) against potentially harmful operation.

The pulse extender 390 is arranged to receive an active transition of the output of the comparator 340 and to generate an output pulse (e.g., a pulsed reset signal). The output pulse is extended such that spurious transitions are avoided and/or sufficient time is provided for the protected circuitry to properly respond to restoration of a proper operating voltage. The buffer 392 is operable to buffer the pulsed reset signal such that remote circuitry (which might include many inputs and/or long net lengths) can properly receive the pulse reset signal.

Figure 4:
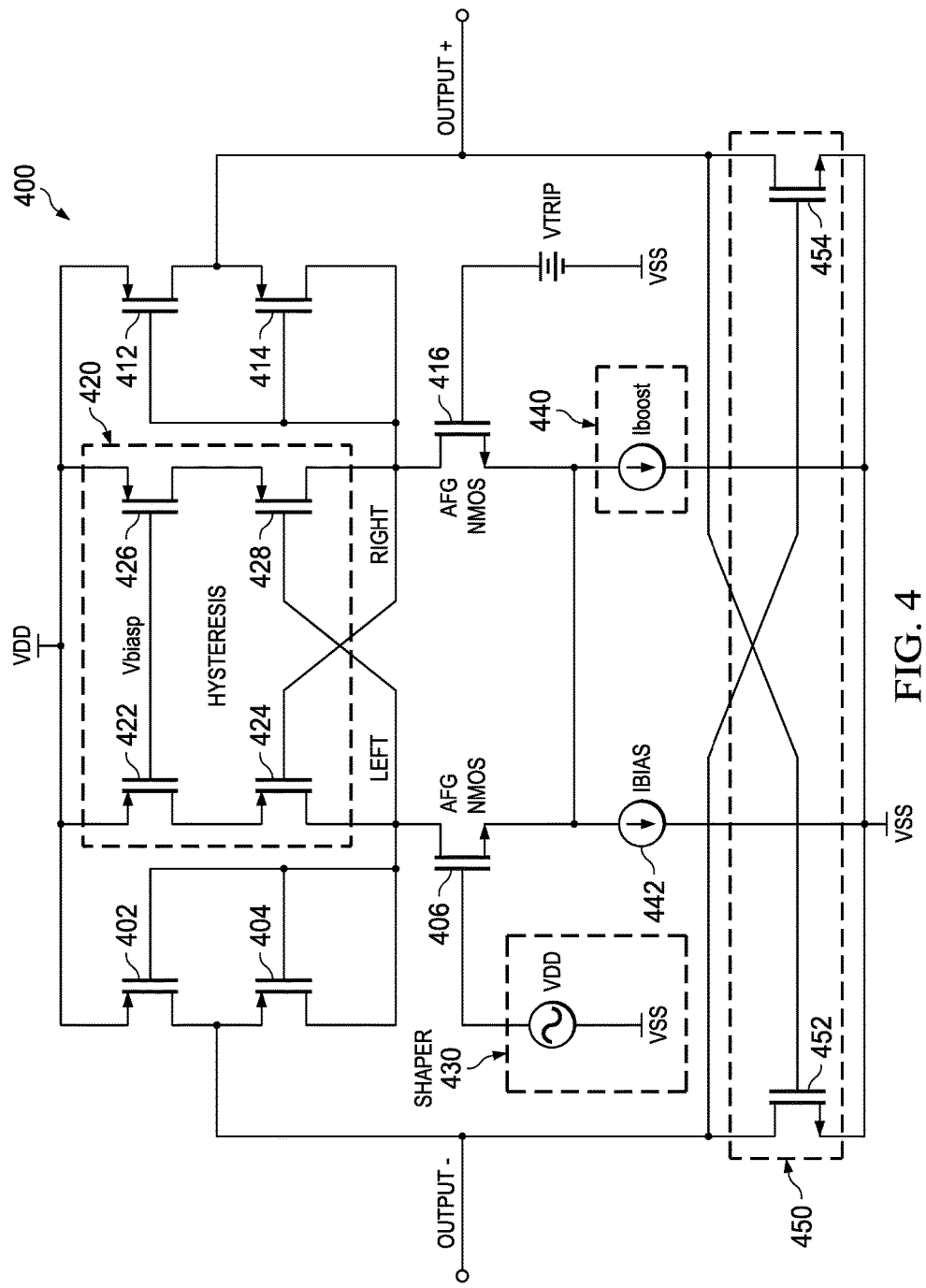
FIG. 4 is a schematic of a comparator for a low power reset circuit including an AFG-based voltage reference in accordance with embodiments of the present disclosure.

FIG. 4 is a schematic of a comparator for a low power reset circuit including an AFG-based voltage reference in accordance with embodiments of the present disclosure. The comparator 400 includes transistors 402, 404, 406, 412, 414, 416, 422, 424, 426, 428, 452, and 454. The "head" of comparator 400 includes a hysteresis circuit 420 (which is described below with reference to FIG. 6) operable to generally help urge the LEFT feedback signal to a potential that is lower than a potential of the RIGHT feedback signal.

The inputs to the comparator 400 are respectively coupled to the gates of transistors 406 and 416. Transistors 406 and 416 are NMOS transistors having analog floating gates (AFG), which helps ensure substantially zero current flow. The output of shaper 430 (which is a shaper such as shaper 330) is a shaped waveform for providing a shaped indication of a current (e.g., existing) level of the operating voltage (e.g., VDD) and is coupled to the gate of transistor 406. The output of voltage source VTRIP (which is a reference voltage such as the voltage asserted at the drain of transistor 376 in response to a voltage generated by the long term storage AFG capacitor 370 device) is for providing a programmable stored voltage level to be used as the trip point (e.g., trigger threshold) and is coupled to the gate of transistor 406.

The AFG transistors 406 and 416 have sources coupled to a common (e.g., tail-current) current source, which operates in a subthreshold mode (e.g., such that a transistor in the subthreshold mode operates in a weak-inversion region), and which controls (e.g., limits the tail current IBIAS. In an embodiment, operation of the comparator 400 in a subthreshold mode typically results in the comparator 400 in drawing a tail current of around 1-10 nanoamps (e.g., which is substantially less than the current otherwise potentially carried through transistors 406 and 416).

To help establish a stable logic state of the comparator 400 feedback circuitry (including the hysteresis circuit 420), an Iboost current source 440 is arranged to boost the tail current by supplementing the IBIAS current from current source 442 with the Iboost current during the powering-up of the comparator 400. The Iboost current source 440 is activated, for example, in response to a power-up event being detected by the shaper 300 (or shaper 500, discussed below) of the positive slew rate of the voltage level of the VDD.

Shifter circuit 450 (which includes transistors 452 and 454) is a level shifter operable to drive the logic outputs of the inverting or non-inverting outputs in response to the logic state maintained by respective potentials of the RIGHT and LEFT feedback signals. Accordingly, a logic "one" (high) output has a voltage that is VDD and a logic "zero" which is lower than VDD by the voltage threshold of transistors 402 and 404 in one state, and a logic "one" (high) output has a voltage that is VDD and a logic "zero" which is lower than VDD by the voltage threshold of transistors 412 and 414 in the second state. The PMOS devices 402 and 404 are formed as one PMOS configured diode load whereas the PMOS devices 412 and 414 are formed as another PMOS configured diode load. The PMOS configured diodes are operable as voltage clamps along with the cross-coupled transistors 424 and 428. Accordingly, voltage levels (e.g., voltage signals) at nodes LEFT and RIGHT normally are limited to voltages between VDD and VDD–VT.

To provide a full-rail "swing" from VSS to VDD, The shifter circuit is operable to convert (e.g., level shift) the smaller swing (which approaches the level of around VDD–VT) to the full swing (which approaches a level around VDD). When the left side of the comparator 400 is "high," the node LEFT swings to VDD and the node RIGHT swings to VDD–VT, whereas when the left side of the comparator 400 is "low," the node LEFT swings to VDD–VT and the node RIGHT swings to VDD. The transistors 402, 404, and 452 convert the OUTPUT– (e.g., negative output signal) to either VDD or 0 v (e.g., VSS), whereas the transistors 412, 414, and 454 convert the OUTPUT+ (e.g., positive output signal) to either to 0 v or VDD. Accordingly, the shifter circuit 450 is operable to output signals in accordance with rail-to-rail (VSS vs. VDD) level shifting.

After the (e.g., initial) powerup of the comparator 400 (and before a brownout event), the LEFT feedback signal is at a lower potential than the RIGHT feedback signal. The LEFT feedback signal is at a lower potential than the RIGHT feedback signal because the operating voltage (e.g., as indicated by the voltage asserted at the gate of transistor 406) is greater than the trip point reference voltage (e.g., as generated from the AFG capacitor 370). When the operating voltage falls below the trip point (e.g., threshold) voltage, the RIGHT feedback signal is driven to a higher potential than the LEFT feedback signal (e.g., thus triggering a brownout reset signal).

As described below with reference to FIG. 6, a (e.g., current-starved) hysteresis is applied with respect to between the RIGHT feedback signal and the LEFT feedback signal during a brownout recovery event. The applied hysteresis helps to avoid a premature release of the (e.g., brownout) reset signal in the possible event of the power supply (e.g., once again) failing, and helps ignore minor perturbations such as noise voltage from the supply to cause the comparator output to toggle (e.g., glitch repeatedly between) high and low. Accordingly, the applied hysteresis is operable to toggle when the input voltage changes by a sufficient amount (e.g., the amount of applied hysteresis) and the comparator has reached a stable state.

Figure 5:
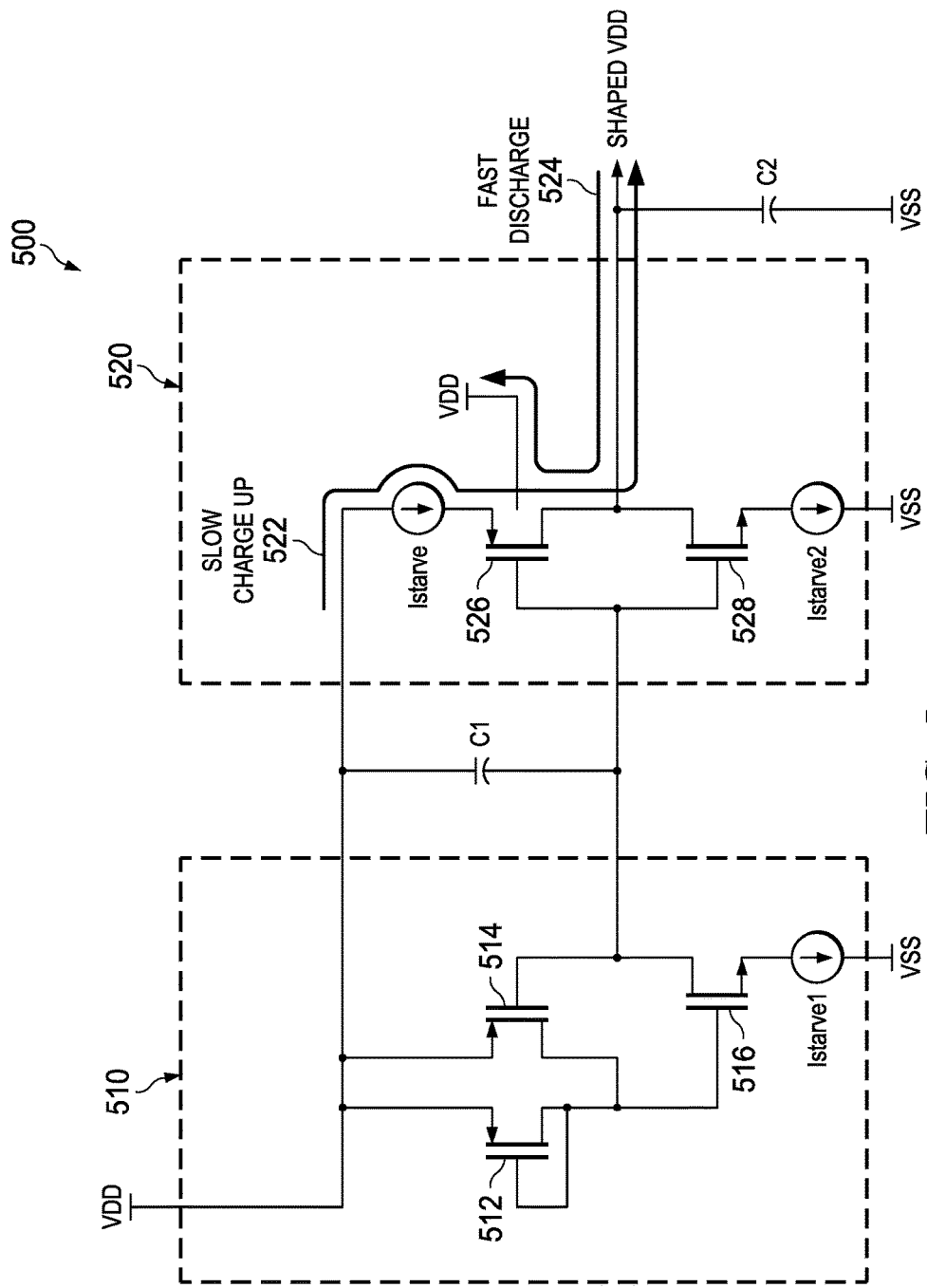
FIG. 5 is a schematic of a shaper for generating a shaped waveform for a reset circuit in response to an operating voltage in accordance with embodiments of the disclosure.

FIG. 5 is a schematic of a shaper for generating a shaped waveform for a reset circuit in response to an operating voltage in accordance with embodiments of the disclosure. Shaper 500 is a shaper such as shaper 330. Shaper 500 includes a substantially zero current operating voltage detector 510 (e.g., for generating an indication of the operating voltage VDD during power up) and a substantially zero current inverter 520 (e.g., for buffering the output of the operating voltage indicator). The shaper 500 is operable to generate a shaped waveform for indicating (e.g., an instantaneous analog measurement of) a voltage coupled to node VDD.

The detector 510 includes power supply (e.g., positive) VDD and (e.g., negative) VSS inputs (e.g., such that current flows in through the VDD input node and, at least partially, out through the VSS node). The VDD input is coupled to the sources of first and second PMOS transistors of detector 510, a positive terminal of capacitor C1, and the bias current source "Istarve" of inverter 520. The bias current source Istarve operates in a subthreshold mode (e.g., such that a transistor in the subthreshold mode operates in a weak-inversion region), which controls (e.g., limits and/or starves) the current flowing through transistor 526.

The first PMOS transistor 512 includes a drain coupled to the gate, to the drain of the second PMOS transistor 514, to the gate of the NMOS transistor 516, and is for generating a first control current in response to the applied VDD. The second PMOS transistor 514 is operable to generate a second control current in response to a voltage developed at the negative terminal of capacitor C1. The first and second currents have no direct current path to ground and are operable to control the channel of the NMOS transistor 516. The NMOS transistor 516 includes a drain that is coupled to the gate of the second PMOS transistor 514 and a source that is biased by current source Istarve1.

The inverter 520 includes a PMOS transistor 526 and an NMOS transistor 528. The source of PMOS transistor 526 is coupled to receive a starved bias current (Istarve) and the source of the NMOS transistor 528 is coupled to receive a starved bias current (Istarve2). The gates of the PMOS transistor 526 and the NMOS transistor 528 are both coupled to the negative terminal of capacitor C1. Accordingly, (e.g., with the exception of switching times) only one of the PMOS transistor 526 and the NMOS transistor 528 is normally active at a time, and the logical output of the inverter 520 is the opposite of the state of the logical input coupled to the gates of the PMOS transistor 526 and the NMOS transistor 528.

The starved current sources of shaper 500 help ensure that the transistors of shaper 500 operates in a subthreshold mode. Operating in a subthreshold mode helps ensure (e.g., substantially) zero static power is consumed in normal operation. Further, the amount of bias provided by the starved current sources of shaper 500 is similar to the amount of bias provided by the starved current sources of comparator 400. The similarity of the amount of bias provided by such starved current sources helps ensure similar operation between the comparator 400 and the shaper 500 during power-up times. For example, the similar operation includes an operation such as generating a slew-rate dependent delayed indication of the operating voltage to provide sufficient time for the comparator 400 tail current to also ramp for accurate comparator operation.

In operation, applying power to a circuit (e.g., that is to be reset-protected during power-up times and power brownouts) causes the voltage VDD to rise from around zero volts to a normal operating voltage. Initially, all circuit nodes in the detector 510 and the inverter 520 are typically discharged to VSS. When power is applied, the (e.g., positive) slew rate of VDD applied to the positive terminal capacitors C1 initially induces the negative terminal of capacitor C1 to a positive logic state. The positive logic state prevents the second PMOS transistor 514 from conducting and forces the logic state of the output of inverter 520 to a negative logic state.

As the input (VDD) of the shaper 500 ramps upwards, the capacitor C1 drives (e.g., AC-couples) the negative terminal of the capacitor C1 towards VDD, which initially shuts off the PMOS 514 and turns on NMOS 528. When NMOS 528 is turned on, the output (shaped VDD) is driven to VSS in response. Accordingly, the shaped VDD (which is now being driven to a low level) is coupled to the comparator to indicate the supply input voltage is low. As the input VDD further rises, the PMOS device 512 and the Istarve1 current source both turn on. Accordingly, the gate of NMOS 516 starts tracking a nominal VDD level (e.g., which is the quantity of VDD minus VT due to the diode-configured PMOS structure 512). When VDD reaches VDD–VT, the gate voltage of NMOS 516 is sufficient to turn on the NMOS 516. When NMOS 516 turns on, the negative node of capacitor C1 is pulled down towards VSS. In response to the negative node of capacitor C1 being pulled down, the PMOS 514 turns on, which pulls the gate of NMOS 516 fully high (e.g., from VDD–VT to VDD). When the gate of NMOS 516 is fully high, the gate of NMOS 528 is VSS, which turns off the NMOS 528 while the PMOS 526 turns on, which starts pulling up the voltage of the shaped VDD output (which is coupled to the positive terminal of capacitor C2). Accordingly, a relatively gradual (e.g., slow) ramping, delayed input is generated and coupled to the gate of NMOS 406 of the first (e.g., top) input of the comparator 340.

As the voltage VDD approaches the normal operating voltage, the slew rate of VDD substantially decreases. When the slew rate of VDD sufficiently decreases and the voltage indicating the positive logic state is substantially pulled-down via the NMOS transistor 516, the logic state of the negative terminal of capacitor C1 is changed to a negative logic state. The now-negative logic state forces the logic state of the output of the inverter 520 to a positive logic state (e.g., which charges capacitor C2) and turns off the second PMOS transistor 514. Accordingly, the output of the inverter 520 is operable to provide a delayed indication of the operating voltage when the slew rate of VDD is positive.

For example, the shaper 500 is operable to provide a delayed indication of the operating voltage in during an (e.g., initial) ramping of VDD such that comparator 340 and/or 400 does not output a spurious transition in response to a relatively high slew rate ramping of the operating voltage. When the application of power (e.g., during power up) to the comparator is applied at a relatively fast slew rate directly to the comparator, the comparator would (e.g., otherwise) generate a spurious output. The spurious output might be generated by the comparator in response to an (e.g., logically) unsafe operating condition where the faster-rising operating voltage applied to the inverting input exceeds the slower-rising trip point threshold voltage applied to the non-inverting input as the comparator is being powered up. Accordingly, the shaped indication of the operating voltage to the comparator 400 is delayed by the shaper 500 during the power-up ramping of the operating voltage VDD.

A slow (e.g., due to the charging of capacitors C1 and C2) charge up current 522 is generated during a power-up ramping of the operating voltage VDD (e.g., when the slew rate of the VDD is positive). However, the VDD exhibits a negative slew-rate during the initial portions of a brownout. As discussed above, the brownout conditions can be caused by transients having durations substantially less than many, if not most, durations of power-up ramping times. (Accordingly, conventional reset circuits that rely on low pass filtering of the operating voltage to determine a reset release time can filter out transients that might cause improper operation of circuitry otherwise intended to be protected by the reset circuitry.)

The fast (e.g., due to discharge path provided by the body diode of the PMOS transistor 526) discharge for a 524 is generated during an initial portion of a brownout (e.g., an initial portion of the transient in VDD where the VDD waveform has a negative slew-rate). Accordingly, as the operating voltage applied to inverter 520 starts to fall in the initial portions of a brownout, the capacitor C2 discharges quickly. The rapid discharge of capacitor C2 helps ensure, for example, the logical output of inverter 520 quickly asserts a (e.g., active-low) reset signal is suitable for both holding circuitry to a reset state during power supply ramping of varying lengths and protected circuitry in the event of a fast-transient brownouts.

Figure 6:
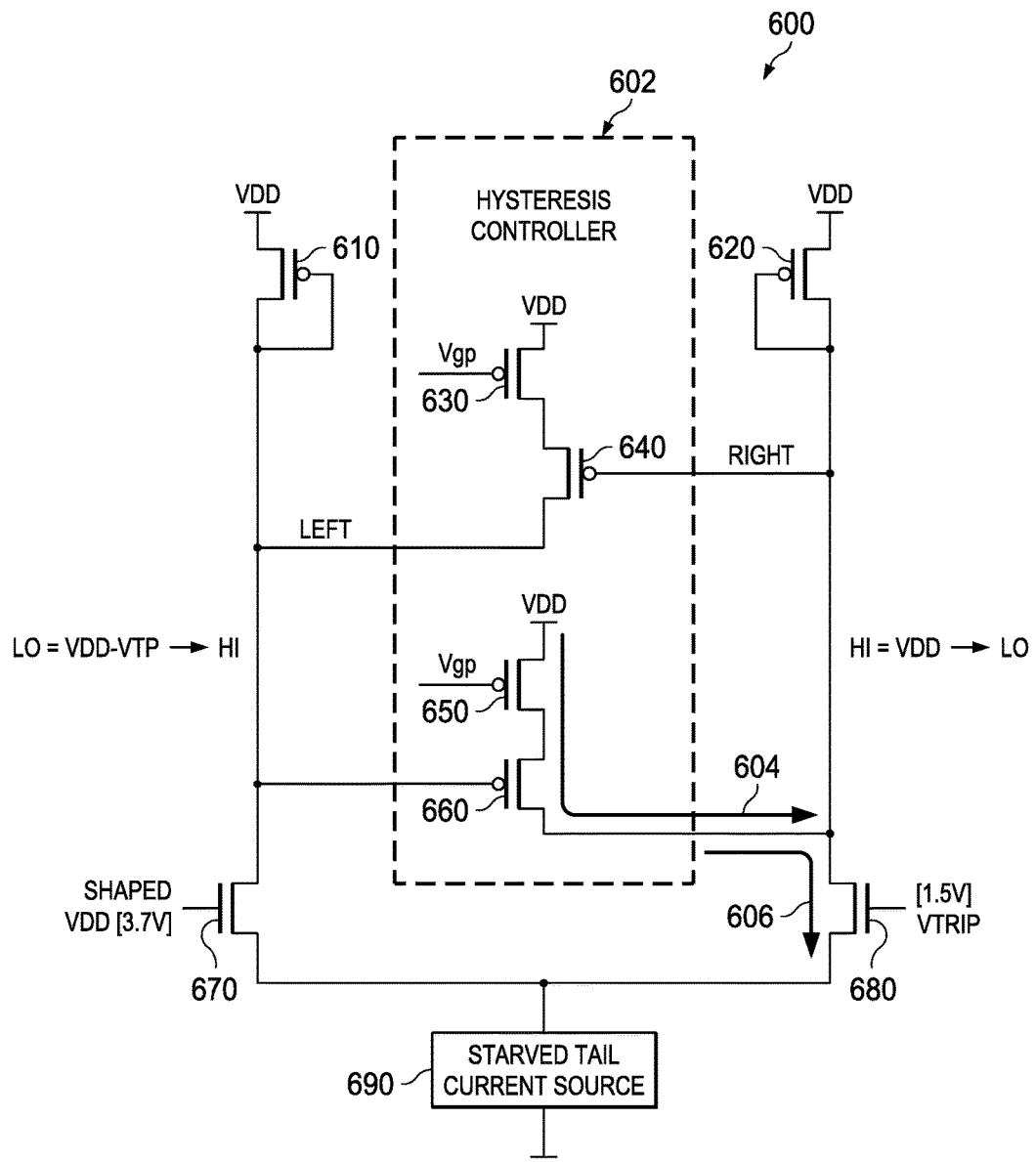
FIG. 6 is a schematic of hysteresis control in a comparator in a low power reset circuit in accordance with embodiments of the disclosure.

FIG. 6 is a schematic of hysteresis control in a comparator in a low power reset circuit in accordance with embodiments of the disclosure. Hysteretic comparator 600 is a differential amplifier including transistors 610, 620, 670, and 680, hysteresis controller 602, and starved tail current source 690. The hysteresis controller 602 includes transistors 630, 640, 650, and 660. The starved tail current source 690 is a current source(s) such as current sources 440 and 442 (as well as tail current booster 740, discussed below).

In operation, the PMOS transistors 630 and 650 are biased using bias voltage Vgp (transconductance voltage for PMOS transistors), which turns on the transistors (e.g., in a sub-threshold mode). The drains of the PMOS transistors 630 and 650 are respectively coupled to cross-coupled hysteresis PMOS transistors 640 and 660. As power is initially applied to the hysteretic comparator 600 (and the shaped VDD signal exceeds the level of the VTRIP signal), the hysteresis controller 602 is operable to force node RIGHT to a high state and node LEFT to a low state. Accordingly, the hysteretic comparator 600 after (e.g., a normal) power up initially holds the state of RIGHT node high and the LEFT node low.

In the event of power supply (e.g., that powers the hysteretic comparator 600) crash, both voltages of the LEFT and RIGHT nodes fall, and the left-side comparator input (shaped VDD, which is coupled to the gate of PMOS transistor 660) also falls). However, the hysteresis tends to prevent the RIGHT node from being (e.g., easily) pulled down to a low state by the right-side comparator input as the applied operating power falls. Accordingly, without the starved tail current source 690 (described below), the brownout condition might not otherwise be detected.

To help avoid potentially adverse effects of a brownout (e.g., a relatively sharp VDD drop and rise, which at least jeopardizes safe operation of electrical circuits), the hysteretic comparator 600 is operable to detect brownout conditions. The starved tail current source 690 is operable to "choke" (e.g., starve) current drained by NMOS transistors 670 or 680. The hysteresis strength is choked by implementing a current-starved hysteresis, such that the comparator inputs can overpower the strength of the feedback hysteresis and switch the state of the LEFT and RIGHT nodes.

For example, current 604 is produced by PMOS transistor 660 during normal operating conditions. The gate of transistor 660 is kept low by NMOS transistor 670 being turned on. As the left-side input (shaped VDD) voltage falls from a high voltage (e.g., 3.7 volts) to a level that is lower than the right-side input (AFG) at (e.g., a constant 1.5 volts), the current drained from transistor 670 decreases as the transistor turns off. In response to the decreased current from transistor 670, the starved tail current source 690 is increasingly able to sink more of current 604 through transistor 680 (e.g., as current 606). Accordingly, sinking a greater amount of current from transistor 680 as VDD falls, helps ensure transitioning of the state of the hysteretic comparator 600 such that the brownout condition can be detected (e.g., no brownout would be detected when the LEFT node would otherwise be kept lower than the RIGHT node).

Figure 7:
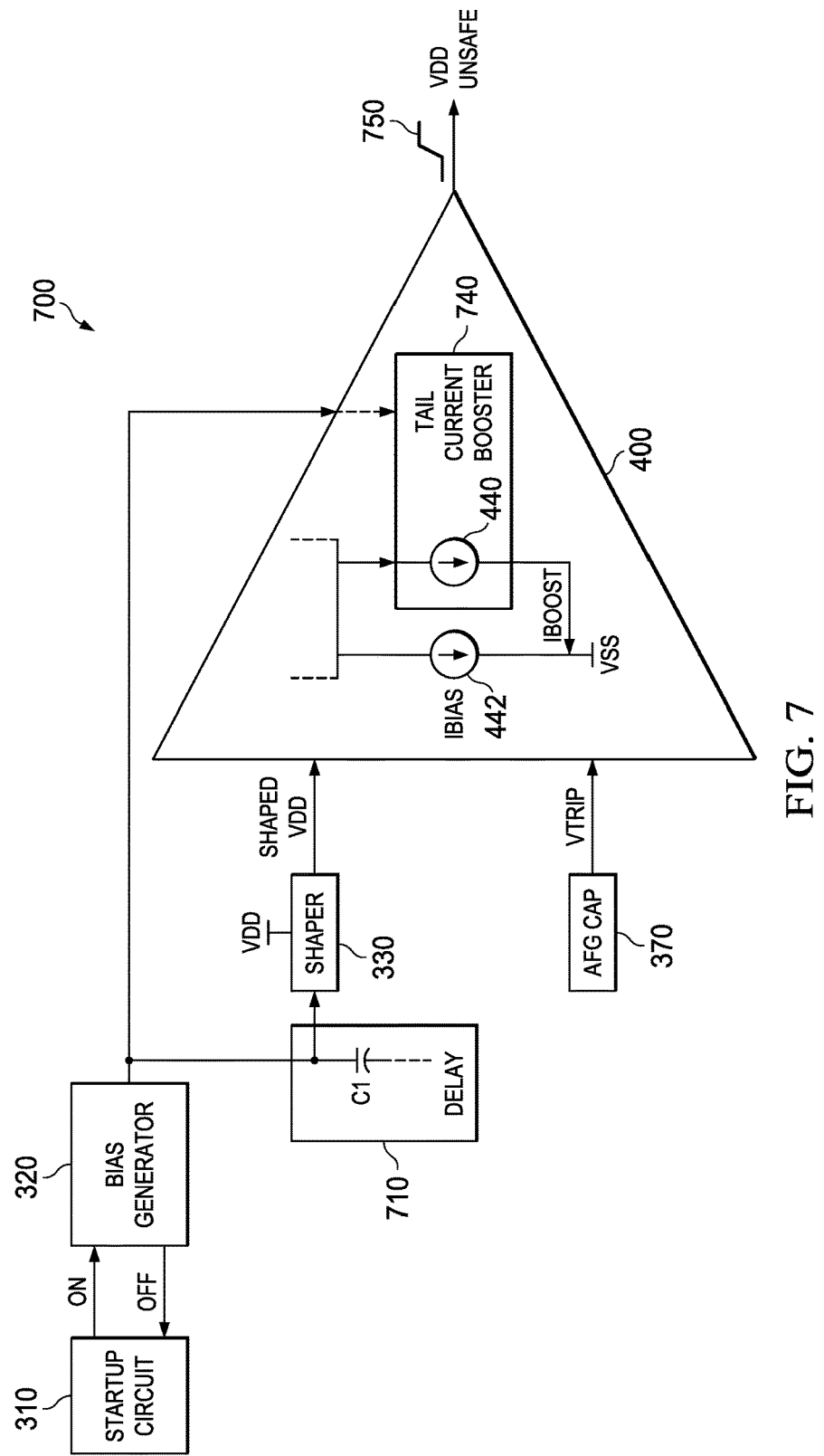
FIG. 7 is a schematic illustrating interoperation of the shaper and comparator in a low power reset signal circuit in accordance with embodiments of the disclosure.

FIG. 7 is a schematic illustrating interoperation of the shaper and comparator in a low power reset signal circuit in accordance with embodiments of the disclosure. Reset signal circuit 700 includes (for example) a shaper 330 and a comparator 400 (e.g., for comparing the shaped VDD against a substantially "zero-current" voltage reference to detect an undervoltage condition of the operating voltage). The shaper 330 is similar to the shaper 500 and is operable for generating a shaped waveform for indicating changes to the existing level of the operating voltage. The comparator 400 is operable to generate a signal (e.g., "VDD unsafe") 750 to indicate that a reset signal should be applied and maintained such that circuitry protected by the reset signal circuit is substantially prevented from operating at unsafe operating voltages (e.g., that can result from brownouts or power supply crashes). The reset signal circuit 700 includes at least two interlocking features (e.g., "interlocks") for providing safe operation in various operating voltage conditions affecting the shaper 300 and the comparator 400.

For example, a first interlock circuit provides safe operation in situations where the (e.g., shaped VDD) input to the comparator 400 is supplied directly to the gate of the NMOS transistor 406 of (e.g., the left side of) the differential stage of the comparator 400. When the input to the comparator rises very fast (e.g., before the comparator 400 can turn completely on during power supply ramping) the input could have exceeded the AFG voltage (VTRIP) being compared, which is coupled to the gate of the NMOS transistor 416 of (e.g., the right side of) the differential stage of the comparator 400. In such a scenario when a comparator turns fully on (and lacks the first interlock circuit), the comparator will normally otherwise provide an indication that the input is "already" greater than the threshold VTRIP. Accordingly, the comparator would normally miss indicating the fact that the initial duration of the power ramping the input was in fact lower than VTRIP during an initial portion of power supply ramping.

Accordingly, shaper 330 (in conjunction with delay unit 710) includes a first interlock circuit and method for "shaping" the waveform of the VDD such that the comparator 400 is operable to detect a from-below-to-above-VTRIP transition of the VDD that occurs before the comparator 400 is fully powered up. Further, the interlock circuit signals the comparator 400 such that the comparator 400 can initially indicate that the input voltage was lower than the VTRIP voltage (before the transition), and subsequently indicate that the input is higher than the VTRIP voltage (after the transition). Accordingly, the comparator 400 is operable to generate a low-to-high transition at the output of the comparator 400 for indicating the from-below-to-above VTRIP transition of the VDD that occurs before the comparator 400 is fully powered up by the ramping power supply.

The speed at (e.g., the length of time in) which the comparator turns on (e.g., reaches an operating voltage at which the point the comparator makes valid comparisons) is a function of the bias current (e.g., Ibias) turn-on time of the bias generator 320. Depending on the process strength, voltage and temperature of the integrated circuit, the bias current turn-on time of the bias generator 320 varies such the turn-on time of the generated signal Ibias (e.g., discussed above with reference to FIG. 4) also can turn on relatively quickly or slowly. Relatively quick turn-on times of the comparator would normally prevent the from-below-to-above VTRIP transition of the VDD from occurring before the comparator 400 is fully powered up. However, the relatively slow turn-on times of Ibias (e.g., resulting from slow power supply ramping) can cause a slow turn-on time of the comparator which (but for the first interlock circuit) would otherwise miss detecting and indicating the transition of the VDD from below to above the VTRIP voltage that occurs before the comparator is fully powered up.

To avoid missing detecting the transition from below to above the VTRIP voltage that occurs before the comparator 400 is fully powered up, the input feeding the comparator gate 406 is delayed by the shaper 330 (and/or delay unit 710) when the bias generator 320 is slow to generate the output shaped voltage. The shaper 330 is operable to receive the bias voltage output from the bias generator, to generate a shaped signal for indicating the operating voltage in response to the bias voltage output, and to output the shaped signal for coupling to the comparator gate of transistor 406. For example, the shaper receives the operating voltage at the terminal VDD of detector 510 (see FIG. 5) and delays the propagation of the coupled operating voltage through detector 510, capacitor C1, the inverter 520, and the capacitor C2. The output of inverter 520 ("shaped VDD") is then coupled to the input of the comparator gate 406. The signal "shaped VDD" indicates an "unsafe," low level of VDD when the "shaped VDD" signal is low and, when the "shaped VDD" signal is high, indicates a safe (e.g., sufficiently high) level of VDD.

Accordingly, the first interlock is operable such that turn-on times of the bias generator 320 and the comparator 400 are both related to the shaper 330 speed of changing the voltage of the shaped signal such that each of the interlocked components (e.g., 320, 400, and 330) all slow down or speed up collectively.

A second interlock, for example, is operable to provide safe (e.g., logically consistant) operation in the event of substantially slow ramping of the bias generator 330, which supplies current for the comparator 400 tail current. The comparator 400 tail current "Ibias" is derived from the bias generator module 320 (e.g., instead of being directly derived from a system VDD). When the system power supply (e.g., supplying the system VDD) ramps up relatively slowly, the bias generator 330 also ramps up relatively slowly, which jeopardizes safe operation of the comparator 400.

Accordingly, the second interlock circuit and methods include a tail current booster such that the comparator has an extra (e.g., in addition to the tail current Ibias) current "Iboost" such that the comparator can start up more quickly. The tail current booster 740 is operable to momentarily apply the current Iboost until the comparator 400 is sufficiently powered up at the time of startup. In an embodiment, the tail current booster 740 is responsive to a rise in the bias voltage received from the bias generator 330 such that the tail current booster 740 is operable to boost the tail current when power is initially applied to the comparator 400. In response to the comparator being powered up (e.g., such that the comparator 400 has achieved a stable state), the tail current booster 740 is operable to shut down (and/or choke) the current Iboost (e.g., to reduce power consumption).

When both Iboost and Ibias are both on, the power consumption of the comparator is increased, which can more rapidly deplete stored system power. To enhance power conservation, the second interlock helps ensure that when the bias generator 320 powers up, the Ibias current source 442 is fully on. The signal used to engage the Ibias current source is forwarded to the Iboost 440 (e.g., by tail current booster 740) such that once the tail current Ibias is fully supplied by the Ibias current source 442, the Iboost current is disengaged. Accordingly, the operation of the bias generator 320 and the comparator 400 are both related to the shaper 330 speed such that each of the interlocked components (e.g., 320, 400, and 330) operate interdependently to ensure safe operation of the comparator 400 and to save system power.

Figure 8:
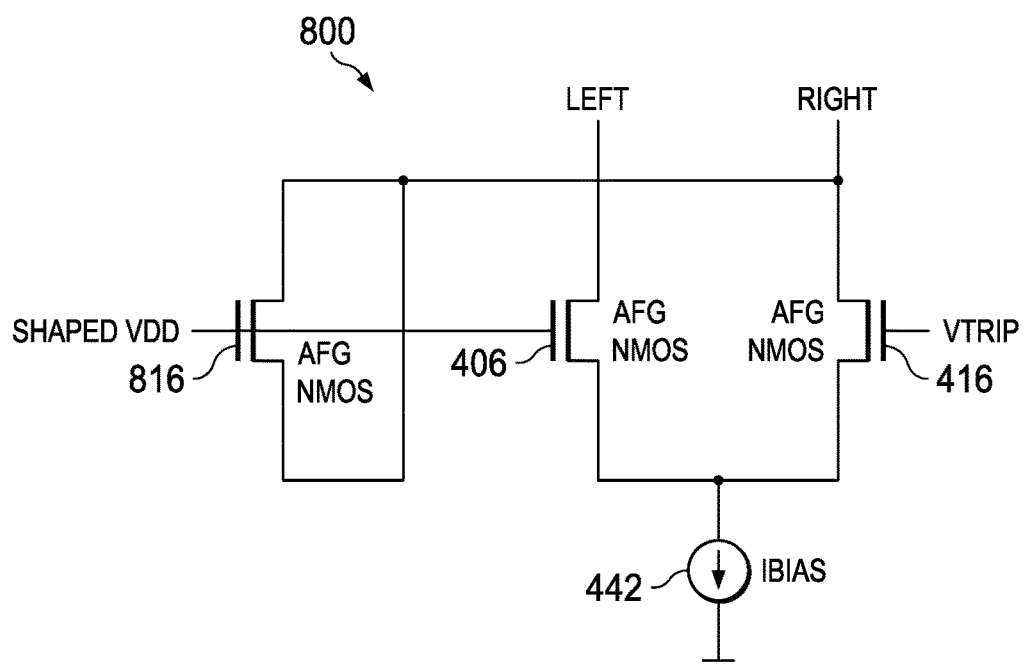
FIG. 8 is a schematic of a capacitive coupling circuit in a low power reset signal circuit in accordance with embodiments of the disclosure.

FIG. 8 is a schematic of a capacitive coupling circuit in a low power reset signal circuit in accordance with embodiments of the disclosure. Capacitive coupling circuit 800 includes the differential amplifier input AFG NMOS transistor 416 (coupled to the RIGHT node of comparator 400) and the differential amplifier input AFG NMOS transistor 406 (coupled to the LEFT node of comparator 400). The shielding circuit also includes an AFG NMOS coupling capacitor 816. The coupling capacitor 816 is an AFG transistor where the source and drain are coupled together (and are also coupled to the RIGHT node of comparator 400) such that a capacitor is formed where the terminals of the transistor form terminals of a capacitor and the gate oxide forms a dielectric. Accordingly, the gate portion of the coupling capacitor 816 is coupled (e.g., connected) to the shaped VDD signal such that the shaped VDD signal is (e.g., parasitically) capacitively coupled to the RIGHT node via the dielectric formed by the gate oxide.

The transistor 406 and 416 form the differential input arms (e.g., left and right current paths of the head) of comparator 400. The shaped VDD input signal is coupled to the gate of transistor 406 while the VTRIP input signal is coupled to the gate of transistor 416. Depending on which of the input voltages is higher at the gates of transistors 406 and 416, the comparator 400 will "trip" (e.g., transition state) to a respective logic state as described above.

The topology of a comparator (such as the comparator 400 illustrated in FIG. 4) typically works safely (e.g., such that presence of parasitic elements does not affect normal operation) when both the inputs coupled to the gates of transistors 406 and 416 are transitioning. However, in the embodiment of FIG. 4, the VTRIP level on the gate of 416 is normally a static and/or constant voltage during operation. In contrast, the voltage of input on the gate of 406 moves (e.g., as rises and falls) substantially in response to any change in the operating voltage, for example, provided as a signal (e.g., per se) and or power rail (e.g., VDD) provided by power supply. The movement of the signal shaped VDD causes a substantial portion of the shaped VDD signal to be parasitically capacitively coupled to the LEFT node of the comparator. The potential adverse effects (such as a comparator switching states at theoretically incorrect values) due to the parasitic coupling are substantially greater when operating in (e.g., low-current) subthreshold modes and/or when power is initially applied (e.g., and/or almost removed).

The coupling capacitor 816 is operable to substantially reduce the adverse effects of the parasitic capacitive coupling, which can substantially reduce the accuracy of the comparator 400 measurements. The shield capacitor is operable to parasitically receive "noise" emitted from the shaped VDD signal by capacitively coupling the so-emitted noise to the RIGHT arm of the comparator 400. The similar capacitive coupling on the RIGHT arm of the comparator mimics the capacitive coupling to the LEFT arm such that common mode (e.g., noise) rejection enhances the signal-to-noise ratio of the combined inputs of comparator 400.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit, comprising:
a bias generator for receiving an operating voltage generated by a power supply and generating a bias voltage in response to the operating voltage;
a shaper for generating, in response to the generated bias voltage, a shaped signal for indicating the operating voltage;
a comparator for comparing a threshold reference voltage with the shaped signal and for generating, in response to the generated bias voltage, a comparison signal for indicating a result of the comparison, wherein the comparator includes a coupling capacitor for capacitively coupling the shaped signal to a comparator node coupled to the threshold reference voltage; and
a reset signal generator for generating, in response to the comparison signal, a reset signal for resetting protected circuitry powered by the operating voltage generated by the power supply.

2. The circuit of claim 1, wherein the bias voltage includes an indication of a slew rate of the operating voltage.

3. The circuit of claim 2, wherein the shaper is operable to delay, in response to the indication of the slew rate of the operating voltage, a change in a voltage of the shaped signal.

4. The circuit of claim 1, wherein the comparator is operable to delay, in response to the indication of the slew rate of the operating voltage, the comparing of the threshold reference voltage with the shaped signal.

5. The circuit of claim 4, wherein the comparator is operable to indicate a condition where the operating voltage is below the threshold reference voltage during a period of time before the comparator is fully powered up in response to a ramping of the power supply.

6. The circuit of claim 4, wherein the speeds of operation of the bias generator and the comparator collectively slow down or speed up in response to variations in the operating voltage.

7. The circuit of claim 6, wherein the shaper is operable, during a ramping of power for the protected circuitry powered by the operating voltage, to delay the change in the voltage of the shaped signal in accordance with the slew rate of the operating voltage.

8. The circuit of claim 7, wherein the comparator is operable to indicate a from-below-to-above-the-threshold-voltage transition of the operating voltage that occurs before the comparator is fully powered up in response to a ramping of the power supply.

9. The circuit of claim 8, wherein the comparator is operable to indicate a brownout operating voltage condition in which any fall in the operating voltage to below the threshold reference voltage is detected.

10. A system, comprising:
a substantially zero-current voltage source for generating a threshold reference voltage, wherein the substantially zero-current voltage source is a quantum tunneling charge storage device;
a bias generator for receiving an operating voltage generated by a power supply and generating a bias voltage in response to the operating voltage;
a shaper for generating a shaped signal in response to the generated bias voltage;
a comparator for comparing the threshold reference voltage with the shaped signal and for providing an indication of the comparison; and
a reset signal generator for generating, in response to the indication of the comparison, a reset signal for resetting circuitry powered by the operating voltage generated by the power supply.

11. A system, comprising:
a substantially zero-current voltage source for generating a threshold reference voltage;
a bias generator for receiving an operating voltage generated by a power supply and generating a bias voltage in response to the operating voltage;
a shaper for generating a shaped signal in response to the generated bias voltage;
a comparator for comparing the threshold reference voltage with the shaped signal and for providing an indication of the comparison;
a reset signal generator for generating, in response to the indication of the comparison, a reset signal for resetting circuitry powered by the operating voltage generated by the power supply; and
a unity gain buffer including an input terminal coupled to the substantially zero-current voltage source and including an output terminal for providing a voltage or current reference for protected circuitry in response to the substantially zero-current voltage source.

\* \* \* \* \*